(12) United States Patent
Nemati et al.

(10) Patent No.: US 7,894,255 B1
(45) Date of Patent: *Feb. 22, 2011

(54) THYRISTOR BASED MEMORY CELL

(75) Inventors: Farid Nemati, Redwood City, CA (US);
Scott Robins, San Jose, CA (US); Kevin J. Yang, Santa Clara, CA (US)

(73) Assignee: T-RAM Semiconductor, Inc., Mountain View, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/881,049

(22) Filed: Jul. 25, 2007

Related U.S. Application Data

(63) Continuation-in-part of application No. 11/159,447, filed on Jun. 22, 2005, now Pat. No. 7,460,395.

(60) Provisional application No. 60/833,458, filed on Jul. 26, 2006, provisional application No. 60/938,751, filed on May 18, 2007.

(51) Int. Cl.
*G11C 11/34* (2006.01)
(52) U.S. Cl. .................. 365/174; 257/163; 438/133
(58) Field of Classification Search .......... 365/174, 365/178, 148, 158, 159, 179, 181, 182; 257/163, 257/156, 107; 438/133, 135
See application file for complete search history.

(56) References Cited

U.S. PATENT DOCUMENTS

| | | | |
|---|---|---|---|
| 4,604,728 A | 8/1986 | Okajima | |
| 5,285,083 A | 2/1994 | Pulfrey et al. | |
| 5,412,598 A | 5/1995 | Shulman | |
| 5,514,882 A | 5/1996 | Shulman | |
| 6,046,475 A | 4/2000 | Chang et al. | |
| 6,104,045 A | 8/2000 | Forbes et al. | |
| 6,128,216 A | 10/2000 | Noble, Jr. et al. | |
| 6,225,165 B1 | 5/2001 | Noble, Jr. et al. | |
| 6,229,161 B1 | 5/2001 | Nemati et al. | |
| 6,462,359 B1* | 10/2002 | Nemati et al. | 257/107 |
| 6,503,790 B2 | 1/2003 | Noble, Jr. et al. | |

(Continued)

OTHER PUBLICATIONS

Shulman, Dima D., "A Static Memory Cell Based on the Negative Resistance of the Gate Terminal of p-n-p-n Devices," IEEE Journal of Solid State Circuits, vol. 29, No. 6, 1994, pp. 733-736.

(Continued)

*Primary Examiner*—Dang T Nguyen
(74) *Attorney, Agent, or Firm*—The Webostad Firm

(57) ABSTRACT

A new memory cell contains only a single thyristor without the need to include an access transistor. A memory array containing these memory cells can be fabricated on bulk silicon wafer. Each memory cell is separated from other memory cells by shallow trench isolation regions. The memory cell comprises a thyristor body and a gate. The thyristor body has two end region and two base regions. The gate is positioned over and insulated from at least a portion of one base region and offset from another base region. A first end region is connected to one of a word line, a bit line and a third line. A second end region is connected to another of the word line, bit line, and third line. The gate is connected to the remaining of the word line, bit line and third line.

10 Claims, 21 Drawing Sheets

U.S. PATENT DOCUMENTS

| | | | |
|---|---|---|---|
| 6,545,297 | B1 | 4/2003 | Noble, Jr. et al. |
| 6,727,528 | B1 | 4/2004 | Robins et al. |
| 6,767,770 | B1 | 7/2004 | Horch et al. |
| 6,790,713 | B1 | 9/2004 | Horch |
| 6,815,734 | B1 * | 11/2004 | Horch et al. ............... 257/133 |
| 6,818,482 | B1 | 11/2004 | Horch et al. |
| 6,885,581 | B2 | 4/2005 | Nemati et al. |
| 6,888,176 | B1 | 5/2005 | Horch et al. |
| 6,944,051 | B1 | 9/2005 | Lee et al. |
| 7,042,759 | B2 | 5/2006 | Nemati et al. |
| 7,075,122 | B1 * | 7/2006 | Yang et al. ................ 257/163 |
| 7,245,525 | B1 | 7/2007 | Lee et al. |
| 7,460,395 | B1 * | 12/2008 | Cho et al. .................. 365/180 |
| 2005/0233506 | A1 * | 10/2005 | Horch et al. ............... 438/134 |
| 2006/0139996 | A1 | 6/2006 | Nemati et al. |
| 2006/0227601 | A1 * | 10/2006 | Bhattacharyya ............ 365/177 |

OTHER PUBLICATIONS

T. Park, et al., "Fabrication of Body-Tied FinFETs (Omega MOSFETs) Using Bulk Si Wafers," 2003 Symposium on VLSI Technology Digest of Technical Papers.

T. Sugizaki, et al., "Low Voltage/Sub-ns Operation Bulk Thyristor-SRAM (BT-RAM) Cell with Double Selective Epitaxy Emitters (DEE)," 2007 Symposium on VLSI Technology Digest of Technical Papers.

* cited by examiner

THYRISTOR BASED MEMORY CELL

RELATED PATENT DOCUMENTS

This application is a continuation-in-part of application Ser. No. 11/159,447 filed Jun. 22, 2005 now U.S. Pat. No. 7,460,395. This application also claims the benefit of U.S. provisional patent application Ser. No. 60/833,458 filed Jul. 26, 2006 and Ser. No. 60/938,751 filed May 18, 2007. All these patent applications are incorporated herein by reference.

BACKGROUND

The performance of logic has increased by two orders of magnitude over the past decade while the performance of memory has increased by less than a factor of two. Memory has become the critical bottleneck in most systems ranging from servers to routers to communications equipments. For example, the Internet revolution dramatically accelerated network performance requirements, but the technological limits of dynamic random access memory (DRAM) and static random access memory (SRAM) have created a bottleneck defined by the slow speed of DRAMs and the low density of SRAMs. System designers have struggled for years to find a solution that successfully matches the density of DRAM with the high speed of SRAM. Recently, a new kind of memory cell based on a breakthrough Negative Differential Resistance based (NDR-based) SRAM cell has been developed. It provides the best of both worlds: SRAM speeds paired with DRAM density. The result is a memory cell that is four times faster than existing DRAMs and four times denser than state-of-the-art SRAMs. More detailed information about such memory cell can be found in U.S. Pat. No. 6,229,161.

Although the above mentioned NDR based SRAM memory cell provides better size/performance over conventional SRAM and DRAM, there is a need to further improve the size/performance of memory.

SUMMARY

The present invention relates to a memory cell that has a thyristor and is implemented on a bulk silicon wafer. Although, only single thyristor memory cell embodiments are shown here that do not need an access transistor, the same thyristor bulk structure can be extended to memory cells that do include access transistors such as the thyristor based memory cell described in U.S. Pat. No. 6,229,161. In one embodiment, the thyristor is a thin capacitively coupled thyristor. A plurality of the new memory cells can be connected to word, bit, and control lines to form memory arrays.

Advantages and features of the present invention will be apparent from the following detailed description and accompanying drawings.

DETAILED DESCRIPTION

In the following description, numerous specific details are set forth to provide an understanding of exemplary embodiments of the present invention, wherein similar elements between the various embodiments may be annotated similarly. Additionally, readily established circuits or elements of the exemplary embodiments may be disclosed in simplified form (e.g., simplified block diagrams and/or simplified description) to avoid obscuring an understanding the embodiments with excess detail. Likewise, to aid a clear and precise disclosure, description of known structures—e.g., sidewall spacers, gate oxides, conductive lines, voltage sources, contacts, vias, etc.—may similarly be simplified where persons of ordinary skill in this art can readily understand such structures and provisions by way of the drawings and present disclosure.

Figure 1A:
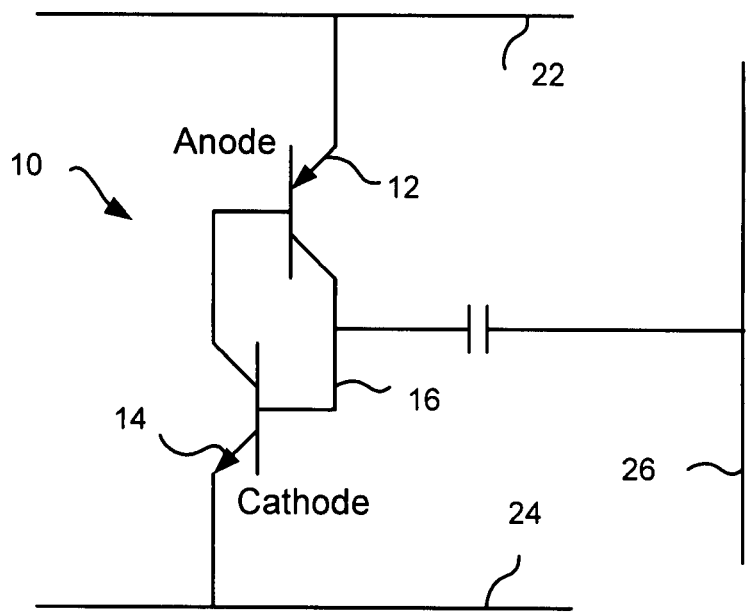
FIGS. 1A and 1B show an exemplary capacitively coupled thyristor memory cell of the present invention.

FIG. 1A is a schematic diagram of a capacitively coupled thyristor memory cell 10 of the present invention. It comprises an anode 12, a cathode 14 and two bases, one of which is labeled 16. Anode 12 is connected to a bit line 22, cathode 14 is connected to a word line 24, and base 16 is capacitively connected to a control (wordline2) line 26.

Figure 1C:
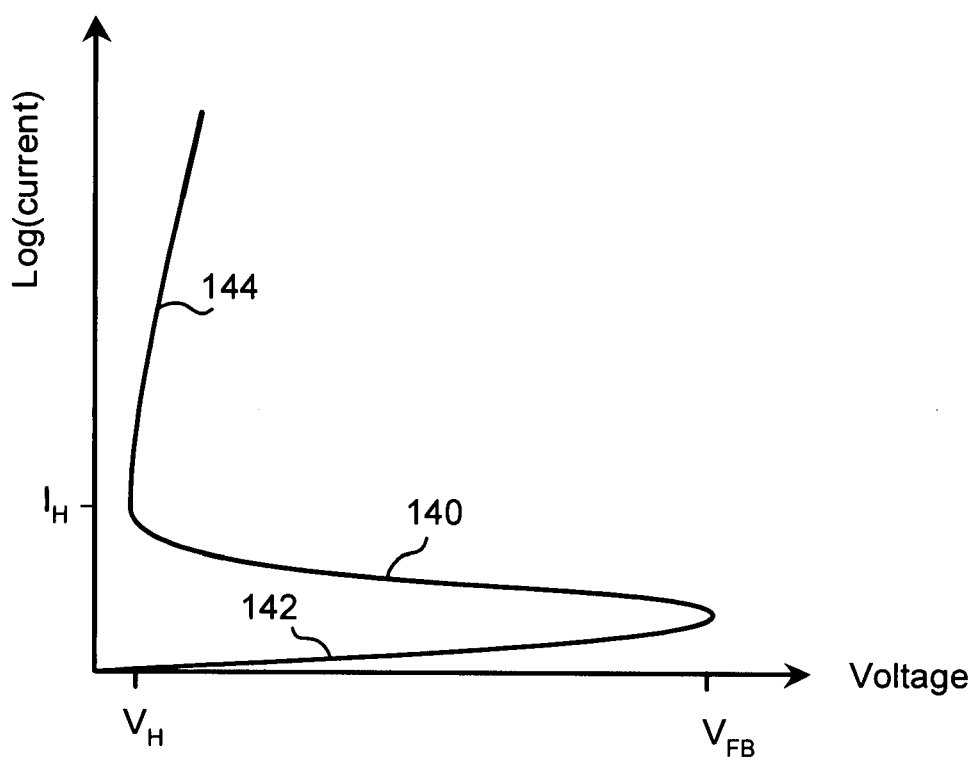
FIG. 1C shows a current-voltage graph of a thyristor of the present invention.
Figure 1B:
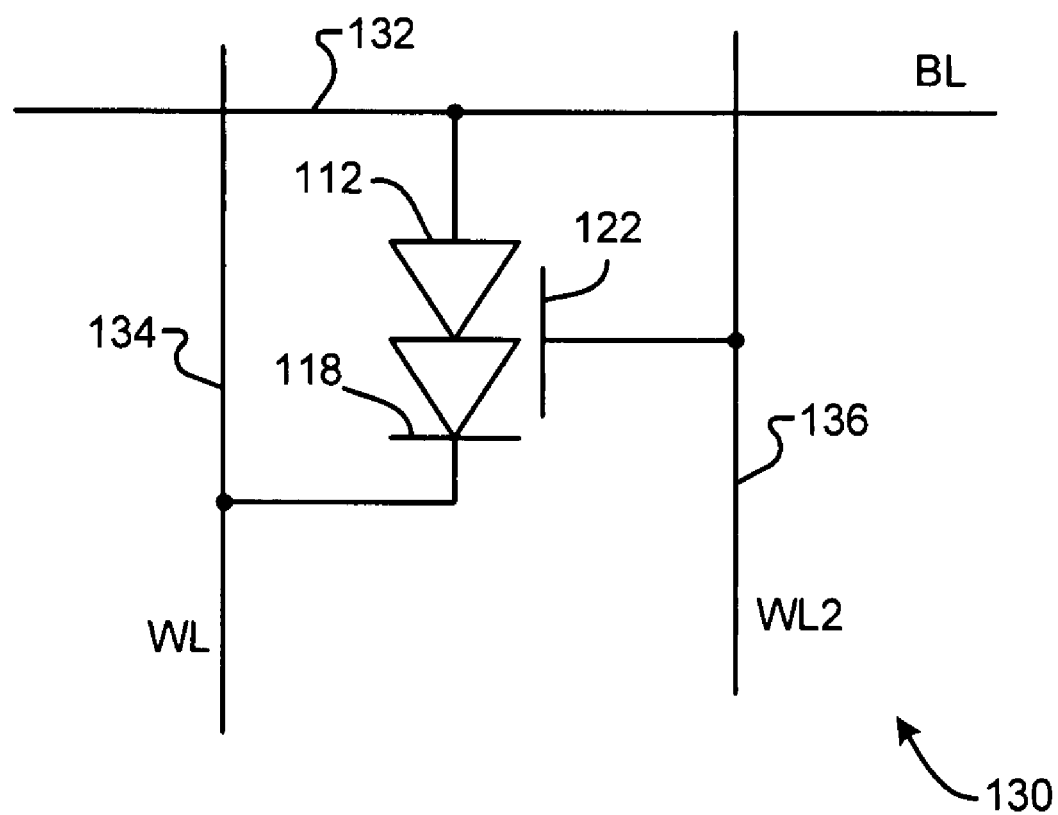

FIG. 1B is another version of a schematic diagram 130 of the thyristor memory cell shown in FIG. 1A. It shows the anode 112, cathode 118, gate 122, bit line (BL) 132, word line (WL) 134 and wordline2 (WL2) line 136.

FIG. 1C is a graph 140 illustrating the current-voltage DC characteristics of a thyristor device of the present invention. It has a non-conducting state 142. Upon application of a voltage larger than a forward blocking threshold voltage $V_{FB}$, the thyristor may abruptly transition to a conducting state 144. The thyristor stays at conducting state 144 while the current and voltage of the base regions drop slowly. When its current drops below a holding current $I_H$ (corresponding to a holding voltage $V_H$), the thyristor may abruptly transition to non-conducting state 142.

Figure 2:
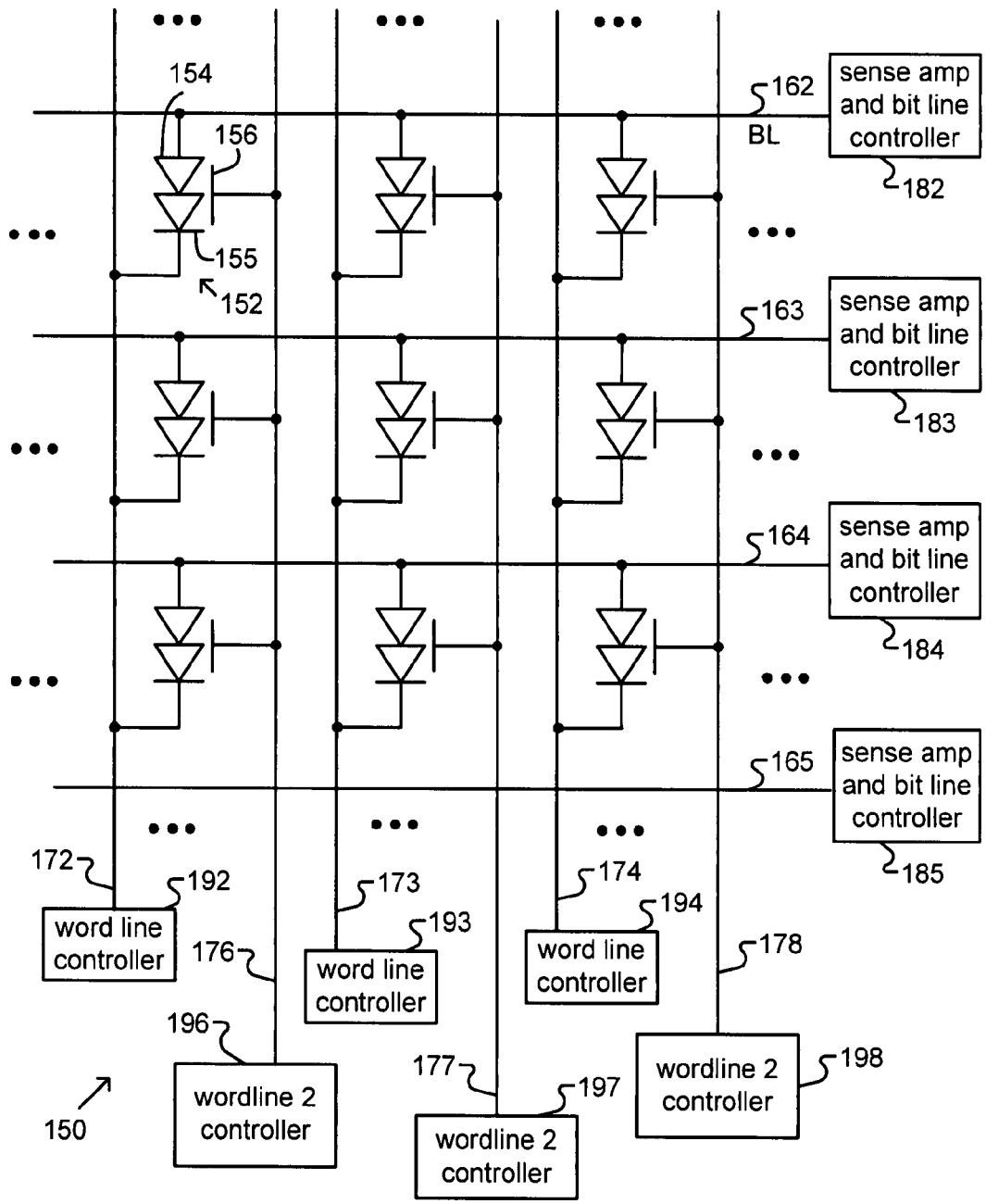
FIG. 2 is a schematic diagram of a portion of an exemplary memory array of the present invention.

A memory array can be formed using the thyristor memory cell of FIG. 1A. FIG. 2 shows a portion of an exemplary array 150 of the present invention. In FIG. 2, only three rows and three columns of thyristors are shown. It should be noted that the present invention is not restricted to any number of rows and columns. An exemplary thyristor 152 is described here. It has an anode 154, cathode 155 and gate 156 connected to a bit line 162, a word line 172 and a wordline2 line 176, respectively. FIG. 2 also shows other bit lines 163-165, other word lines 173-174 and other wordline2 lines 177-178.

In order to operate the array, a plurality of sense amplifier and bit line controllers 182-185, a plurality of word line controllers 192-194 and a plurality of wordline2 controllers 196-198 are used. These controllers provide the proper signals to various bit, word and wordline2 lines at appropriate times. The sense amplifiers are used to determine the data stored in the thyristors. Detailed description of the signal amplitude and timing at various lines of array 150 is provided below.

When a cell is in standby mode, there is no read, write or restore activities. An exemplary voltage arrangement at standby can be: (a) BL is set at 1.2V, (b) WL2 line is set at −2V, and (c) WL is set at 1.2V. It should be noted that the standby voltages of BL and WL do not need to be the same, although the voltage different between BL and WL is preferably less than $V_{FB}$. Also note that the standby voltages of WL2, BL and WL can be positive or negative.

Figure 3B:
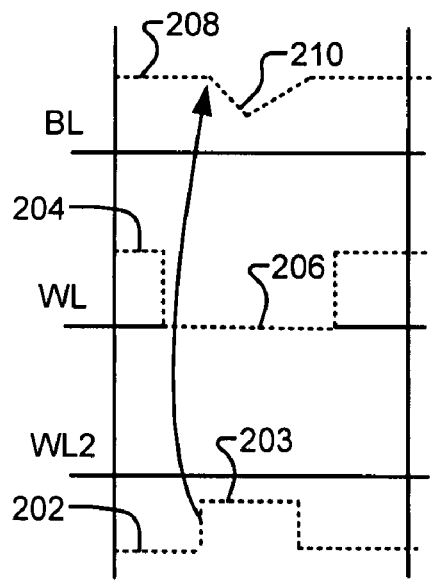
FIGS. 3A and 3B show signal diagrams for read operations of the present invention.
Figure 3A:
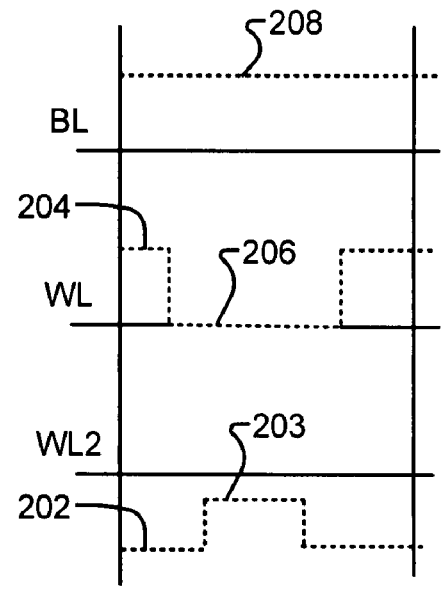

FIGS. 3A and 3B are signal diagrams for a read operation of the present invention when the data is at a "0" state and a "1" state, respectively. These states correspond to the two states of a thyristor: blocking and conducting. For illustrative purposes in the present disclosure, a "0" corresponds to blocking state and a "1" correspond to conducting state. In one embodiment, the WL2 line of the selected cell is pulsed from its standby voltage 202 to a higher voltage 203 and the WL of the selected cell is pulled from the standby voltage 204 to a lower voltage 206. Both WL2 and WL return to their standby voltages near the end of the read cycle. The voltage of the BL (originally at standby 208) is sensed after WL2 and WL changed from their standby voltages. If the voltage of BL remains substantially the same, then the state is "0" (see FIG. 3A). If the voltage of BL decreases 210, then the state is "1" (see FIG. 3B). Before the end of the read cycle, the voltage of BL returns to the standby level. Note that the return timing of WL2, WL and BL can be independent of one another.

Either voltage or current sensing can be used in read operations. In a current sensing scheme, the change in the BL voltage is typically smaller than voltage sensing. Thus, the sense amplifier senses flow of current or the impedance of the BL. If the thyristor is in a blocking state, the current sense amp sees a high impedance or a low current on the BL. If the thyristor is in a conducting state, the current sense amp senses a low impedance or a high current.

Figure 4B:
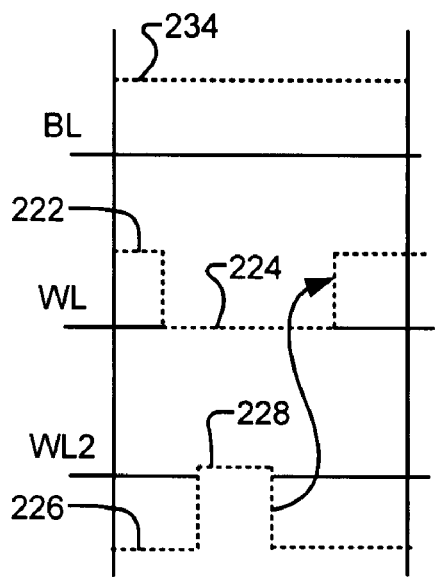
FIGS. 4A and 4B show signal diagrams for write operations of the present invention.
Figure 4A:
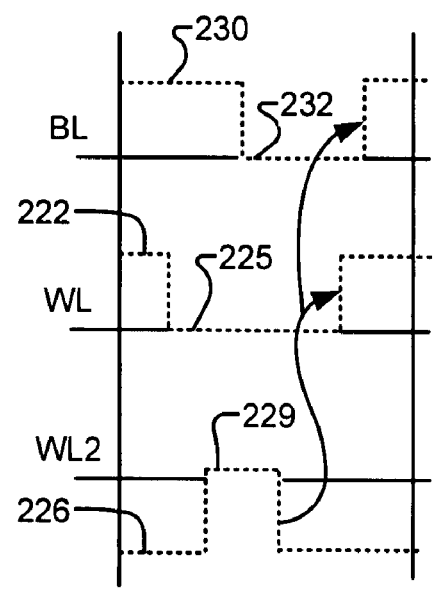

FIG. 4A shows signal diagram for write "0" operation of the present invention. In one embodiment, the BL and WL of the selected cell are pulled from their respective standby voltages (230 and 222) to a lower voltage 232 and 225, respectively. In one embodiment, voltage 232 of BL minus voltage 225 of WL is to be low enough so that the potential of one of the base regions can be substantially modulated by the WL2 line. The WL2 line is pulsed to a higher voltage 229 (either before or after the voltage change of BL and WL). In one embodiment, voltage 229 is higher than the standby voltage by more than about 1V. However, voltage 229 can be higher than the standby voltage by a value ranging from 0.5V to 5.0V. After the WL2 line returns to its standby voltage, the BL and WL return to their standby voltages.

FIG. 4B shows signal diagrams for write "1" operation of the present invention. In one embodiment, the WL of the selected cell is pulled from the standby voltage 222 to a lower voltage 224, and will return to the standby voltage near the end of the write cycle. The WL2 line is pulsed from the standby voltage 226 to a higher voltage 228 (either before or after the rising edge of the WL) and then returns to the standby voltage. In one embodiment, this higher voltage is higher than the standby voltage by more than about 1V. However, voltage 228 can be higher than the standby voltage by a value ranging between 0.5V and 5.0V. For a "1" is to be written to the selected cell, the BL remains at the standby voltage 234 throughout the write cycle.

The signal diagrams illustrated in FIGS. 3A-3B and 4A-4B can be easily implemented by sense amp and bit line controllers 182-185, word line controllers 192-194, and wordline2 controller 196-198.

The data retention and power consumption of the memory array 150 of the present invention can be improved by periodically refreshing the memory cells. Refresh is one method for maintaining data in the memory cells. The data in a cell selected for refresh is read and then written back to the cell. In a refresh operation, a sense amplifier needs to be used to read the data. Word line and wordline2 controllers are used to write back the data. The refresh operation can be applied approximately once every 0.01 to 10,000 milliseconds.

Another method to maintain data in the memory cells of memory array 150 is by periodically restoring the state of the memory cells. One of the states of a thyristor (e.g., "1") can gradually transition to another state (e.g., "0") during standby. However, data in the thyristor can be self-restored by periodically pulsing at least one of the three lines connected to the thyristor. There is no need to involve the sense amplifier or perform read/write operations. In one embodiment of the present invention, the restore operation involves periodically pulsing the word lines of array 150 from the standby voltage to a lower voltage. The pulse width can vary from 0.1 ns to 10 ns. The time interval between restore pulses can vary from 0.01 ms to 500 ms. Background information about restore operation can be found in U.S. Pat. No. 6,885,581 titled "Dynamic data restore in thyristor based memory device." This patent is incorporated herein by reference. The restore operation can be easily implemented by word line controllers 192-194.

Figure 5A:
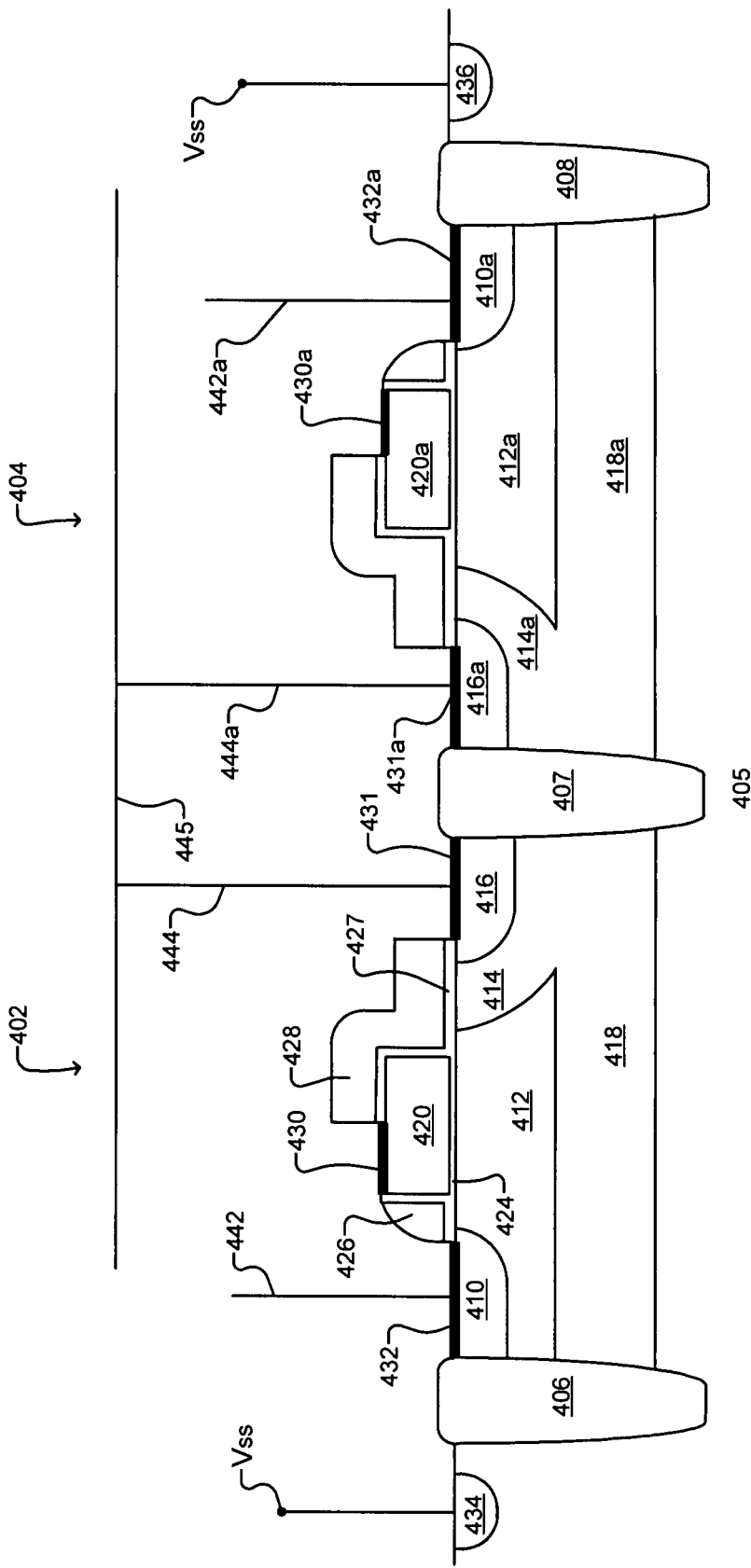
FIG. 5A is a diagram showing the cross section of two adjacent memory cells of the present invention.

Several embodiments of single thyristor memory cells implemented on a bulk silicon wafer will now be described. FIG. 5A shows a cross sectional view of one embodiment. Only two exemplary capacitively coupled thyristor memory cells (402 and 404) are shown. These two cells and other memory cells (not shown) in a memory array are fabricated on a P type substrate 405 ("P-sub"). Cells 402 and 404 are separated from each other and the other memory cells by oxide isolation or shallow trench isolation ("STI") regions 406-408. The structure of these cells are substantially identical, thus only one of the cells (e.g., cell 402) is described in detail. Cell 402 comprises a thyristor body having an N+ region 410, P-base region 412, N-base region 414 and P+ region 416. The thyristor body sits on top of an N-well 418. A control gate 420 is deposited on top of a gate dielectric 424, which is deposited on top of P-base 412. Spacer materials 426-428 may be formed adjacent to control gate 420. Salicide regions 430-432 are formed on top of control gate 420, P+ region 416, and N+ region 410, respectively, in areas not covered by spacer materials 426-428. In one embodiment, memory cell 402 is approximately 1.5 µm wide, including half the width of a STI trench on each side.

Memory cells 402 and 404 can be used in a memory array. For illustration purposes, some of the components of memory cell 404 are assigned reference numerals that are the same as the corresponding components of memory cell 402 with the letter "a" attached at the end. N+ region 410 of cell 402 can be connected to a word line 442 through salicide region 432. Similarly, N+ region 410a of cell 404 can be connected to a word line 442a through salicide region 432a. Salicide region 431 and 431a can be connected to the same bit line 446. Salicide region 430 can be connected to a wordline2 line (not shown). Similarly, salicide region 430a can be connected to another wordline2 line (not shown).

FIG. 5A also shows a P+ tap connection region 434. This region is connected to a supply low voltage Vss (typically at ground). One P+ tap connection region can be used for several memory cells (e.g., 8, 16, etc.). For illustrative purpose, tap connection region 434 is associated with memory cells 402 and 404 while another P+ tap connection region 436 is used to support two memory cells (not shown) to the right of region 436. Region 436 is also connected to voltage Vss.

Figure 5B:
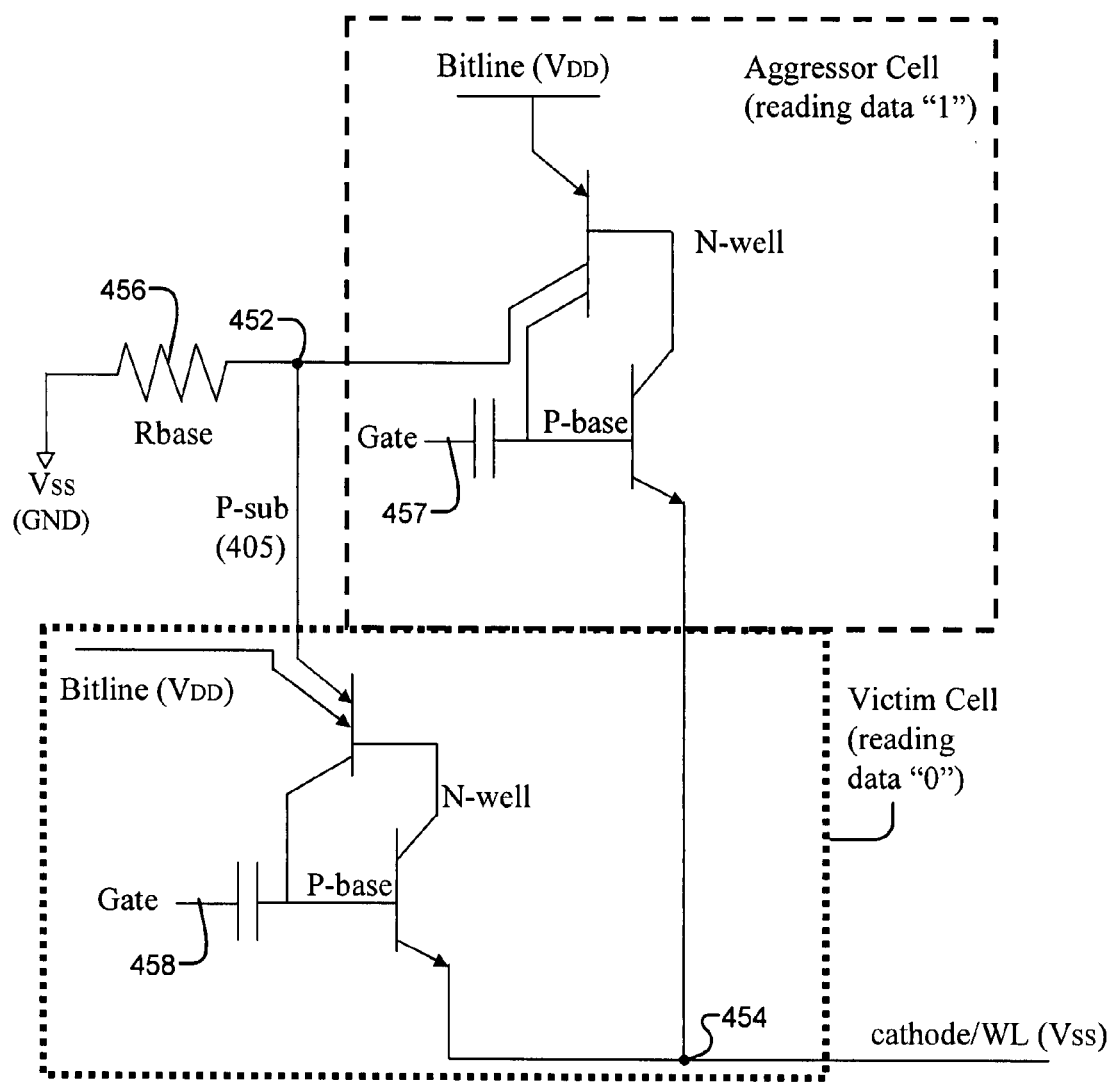
FIG. 5B is a schematic diagram explaining reduction in adjacent bit disturb based on an embodiment of the present invention.

One advantage of the embodiment shown in FIG. 5A is that it has a low adjacent bit disturb risk. Adjacent bit disturb refers to the undesirable situation when data in one memory cell is disturbed (a "victim cell") as a result of reading data in an adjacent memory cell (an "aggressor cell") along the same word or bit line. FIG. 5B shows a schematic diagram of two memory cells of the type described in FIG. 5A along the same word line (which may correspond to memory cell 402 and a cell behind it along the same word line 442). One of the cells is an aggressor cell and the other cell is a victim cell. Both cells are located on the same P-sub (i.e., reference numeral 405 in FIG. 5A). As a result, FIG. 5B shows that that the aggressor and victim cells share the same P-sub node 452 and word line node 454. The schematic diagram in FIG. 5B also shows a resistor 456 to depict the resistance between P-sub and a P+ tap connection region.

In a thyristor based memory cell, injection of holes into the P-base of a victim cell can charge the P-base. This may induce the victim cell to change its state because P-base is a storage node. When data is read from the cells in the schematic of FIG. 5B, a voltage kick is applied to the gates 457, 458 (which correspond to wordline2 of the respective cells) and the common word line 454 is pulled to ground (see FIGS. 3A and 3B). Although the voltage of P-sub may rise above ground due to the presence of resistor 456, injection of holes from P-sub into P-base will only be effective if the N-well bias is sufficiently below the voltage of the P-sub. However, the bitline to N-base/N-well diode will be effective in charging the N-base/N-well to near a supply high voltage $V_{DD}$, so such injection from P-sub to P-base is inhibited. As a result, the adjacent bit disturb risk is reduced.

Figure 6A:
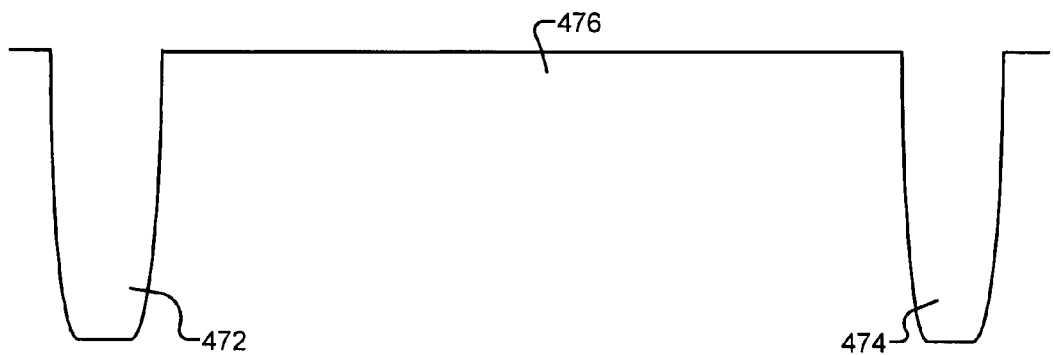
FIGS. 6A-I show the cross section of various steps in the fabrication of the embodiment in FIG. 5A.

One way to fabricate the memory cells 402 and 404 is shown in FIGS. 6A-6I. For simplicity, the details of fabricating one cell are shown. In FIG. 6A, a plurality of trenches, such as trenches 472 and 474, are formed on a lightly doped P-type silicon 476 (e.g., dopant concentration of about $10^{15}$ $cm^{-3}$). The trenches are then filled with an insulating material such as oxide. Trenches 472 and 474 correspond to STI regions 406 and 408, respectively, of FIG. 5A. In one embodiment, the trenches are about 0.4 µm deep and 180 nm wide at the top. A layer of screen oxide 480 is then grown on the top surface of the silicon (see FIG. 6B). In one embodiment, the thickness of screen oxide 480 is about 10 nm. A deep P-type implant, an N-type implant, and a shallow P-type implant are used to form a deep P-well 482 near the bottom of the trenches, an N-well 484 in the middle, and a top P-well 486. For the deep P-well, a boron implant having a dosage of $4 \times 10^{13}$ $cm^{-2}$ and energy of 260 KeV can be used. For the N-implant, an arsenic implant having a dosage of $2 \times 10^{13}$ $cm^{-2}$ and energy of 450 KeV can be used. For the top P-implant, a boron implant having a dosage of $1 \times 10^{13}$ $cm^{-2}$ and energy of 15 KeV can be used. In one embodiment, top P-well 486 and N-well 484 are approximately 100 nm thick. Screen oxide layer 480 can then be removed.

The formation of a gate stack is now described (which corresponds to control gate 420 and gate oxide 424 of FIG. 5A). A gate dielectric (e.g., $SiO_2$) layer 490 is grown on top P-well 486 (see FIG. 6C). In one embodiment, the thickness of layer 490 is about 3 nm. A layer 492 of gate electrode material (e.g., deposit polysilicon) is formed on layer 490. In one embodiment, the thickness of layer 492 is about 150 nm. As an optional step, non-thyristor regions of the silicon is masked off and a P-type dopant (e.g., boron) is implanted in the gate electrode material. Examples of non-thyristor regions are regions for sense amplifiers and word line controllers.

Figure 6B:
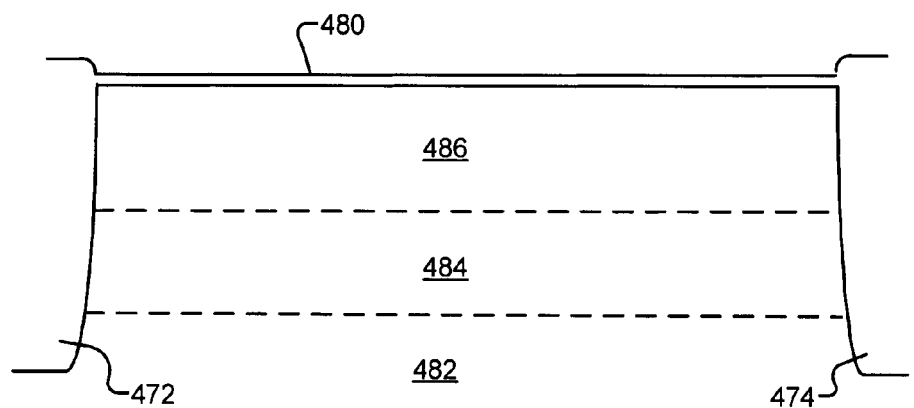
Figure 6C:
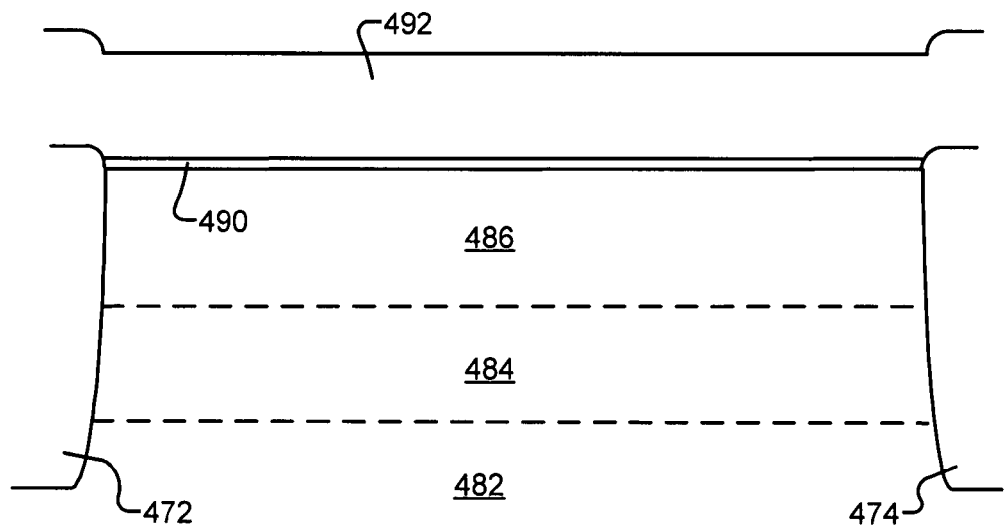
Figure 6D:
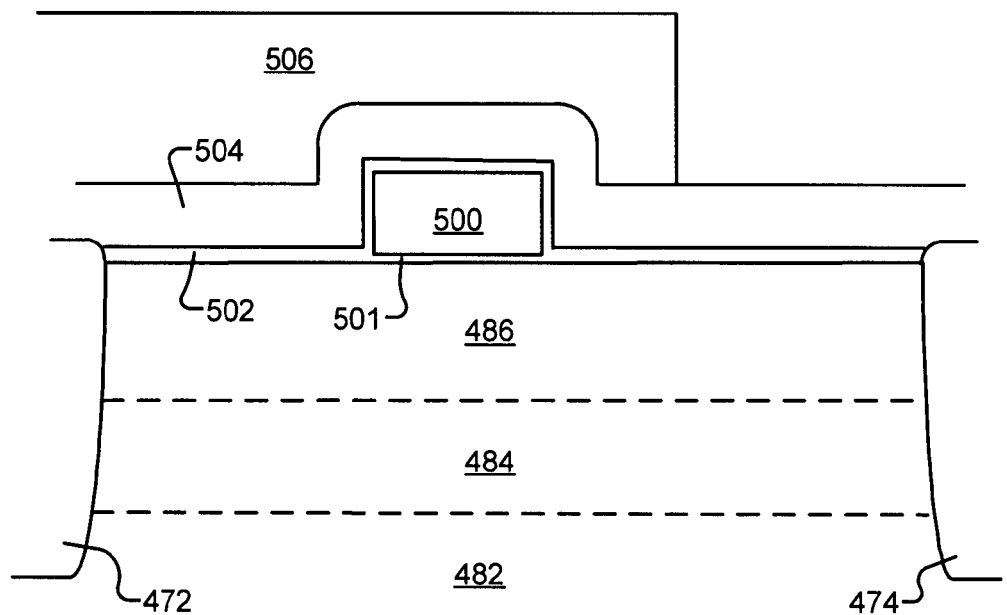
Figure 6E:
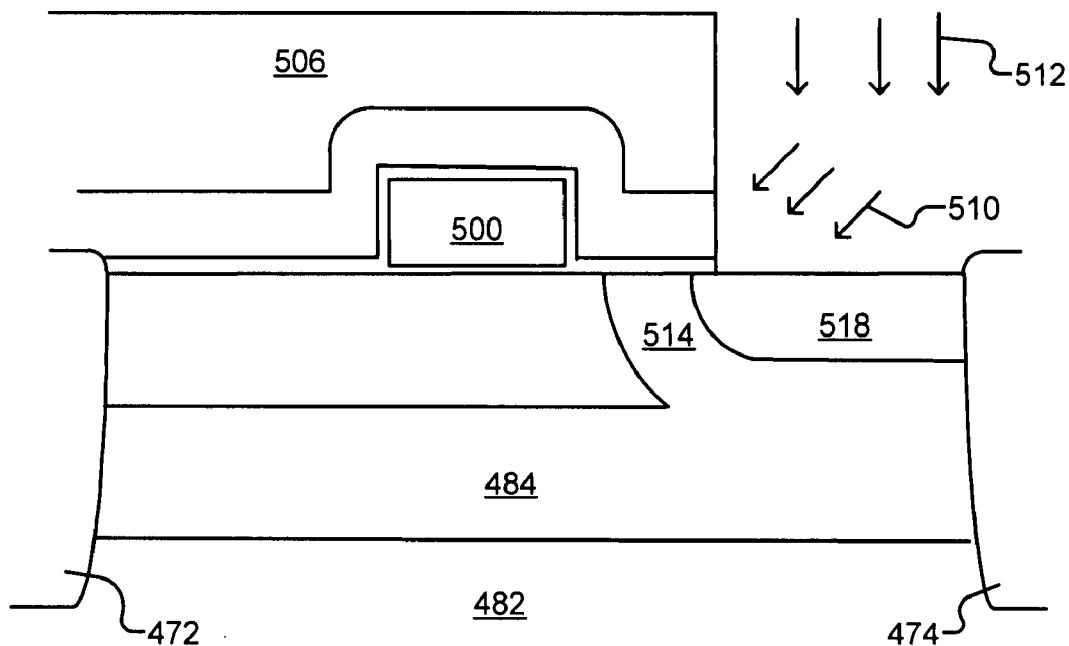
Figure 6F:
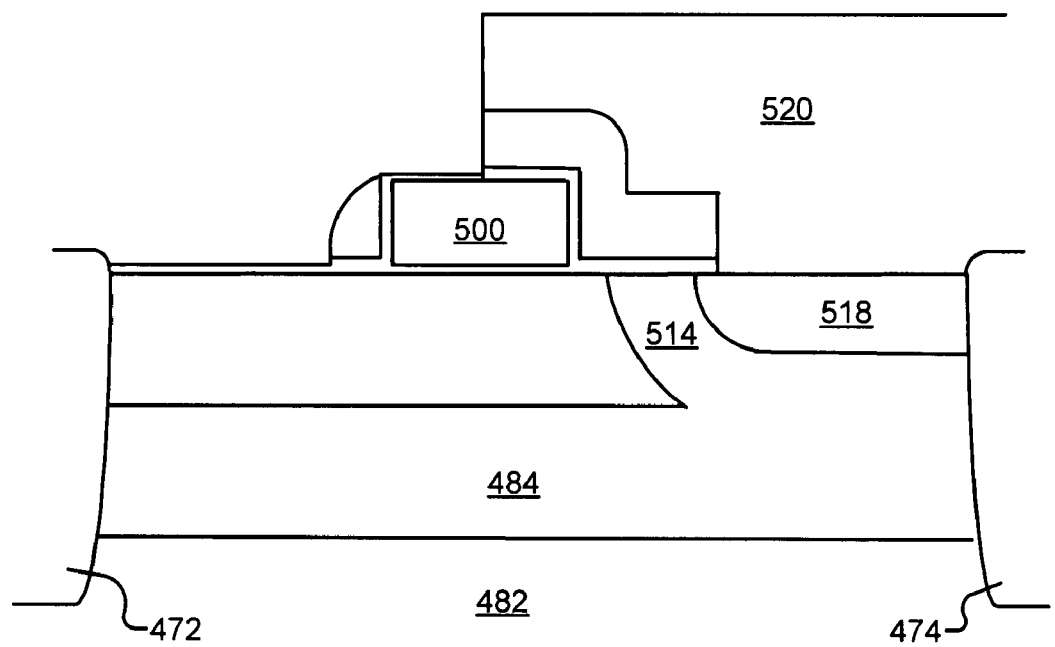

The device of FIG. 6C is then patterned to form a control gate 500 on gate oxide 501 (see FIG. 6D). Spacer material is deposited on top of P-well 486. In one embodiment, a nitride 502 and oxide 504 stack is deposited. The oxide layer can be a few nm thick and the nitride layer can be tens of nm. A photoresist 506 is deposited to define an opening for forming an anode region of the thyristor.

The spacer material at the opening is etched. An angle implant 510 of N-type dopant is used to create an N-base region 514 (see FIG. 6E). A substantially vertical implant 512 of P-type dopant is used to create a P-type anode region 518. In one embodiment, anode region 518 is approximately 100 nm deep and 0.5 µm wide while N-base region 514 is approximately 100 nm wide at the top surface of silicon. A description of anode formation is provided in U.S. Pat. No. 6,767,770 title Method of Forming Self-Aligned Thin Capacitively-Coupled Thyristor Structure, which is incorporated herein by reference. An optional carbon implant can also be performed. Carbon implant is described in U.S. Pat. No. 7,075,122 titled Thyristor Device with Carbon Lifetime Adjustment Implant and Its Method of Fabrication, which is incorporated herein by reference.

Figure 6G:
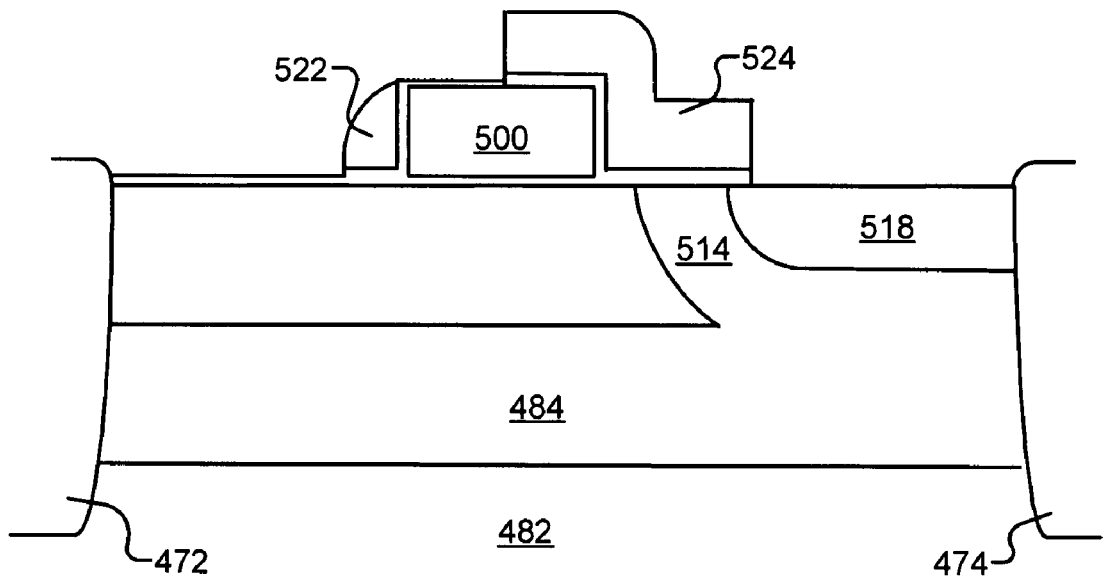
Figure 6H:
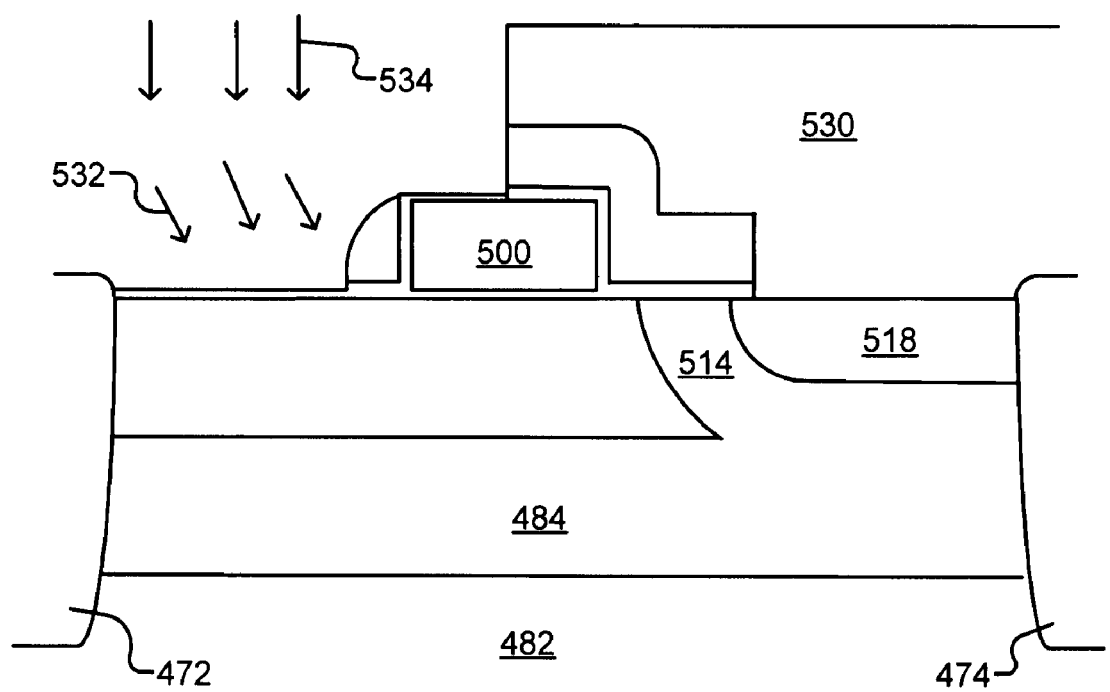

Photoresist 506 is stripped. A new photoresist 520 is deposited to define another opening (see FIG. 6F). This opening covers the cathode region of the thyristor and also regions that are not part of the thyristor. The spacer material that is not protected by photoresist 520 is etched. Etching of spacer material is described in above-mentioned U.S. Pat. No. 6,767,770. FIG. 6G shows the structure after photoresist 520 is stripped. Control gate 500 is surrounded by spacers 522 and 524.

Figure 6I:
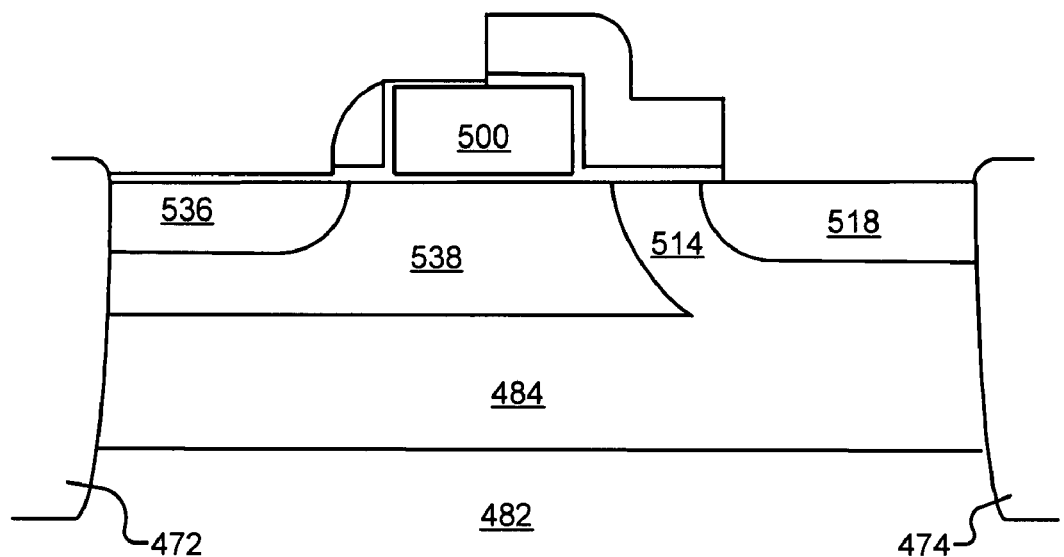

After spacers 522 and 524 are formed, the cathode region is now fabricated. A photoresist 530 is deposited (see FIG. 6H). A substantially vertical implant 534 of N-type dopant (e.g., arsenic) is used to create an N-type cathode region. An angle implant 532 of P-type dopant (e.g., boron) may also be applied for additional doping in the P-base region of the thyristor. Photoresist 530 is then stripped. FIG. 6I shows the resulting structure with the N-type cathode region 536 and a P-base region 538. In one embodiment, cathode region 536 is approximately 80 nm deep and 0.25 µm wide while P-base region 538 is approximately 100 nm deep and 0.5 µm at the top surface of silicon.

Regular CMOS processing, such as rapid thermal anneal and silicide formation, can be used to complete the fabrication. Heavy ion leakage implant can also be applied to the anode region. Details of such implant are described in the above mentioned U.S. Pat. No. 7,075,122.

Figure 7A:
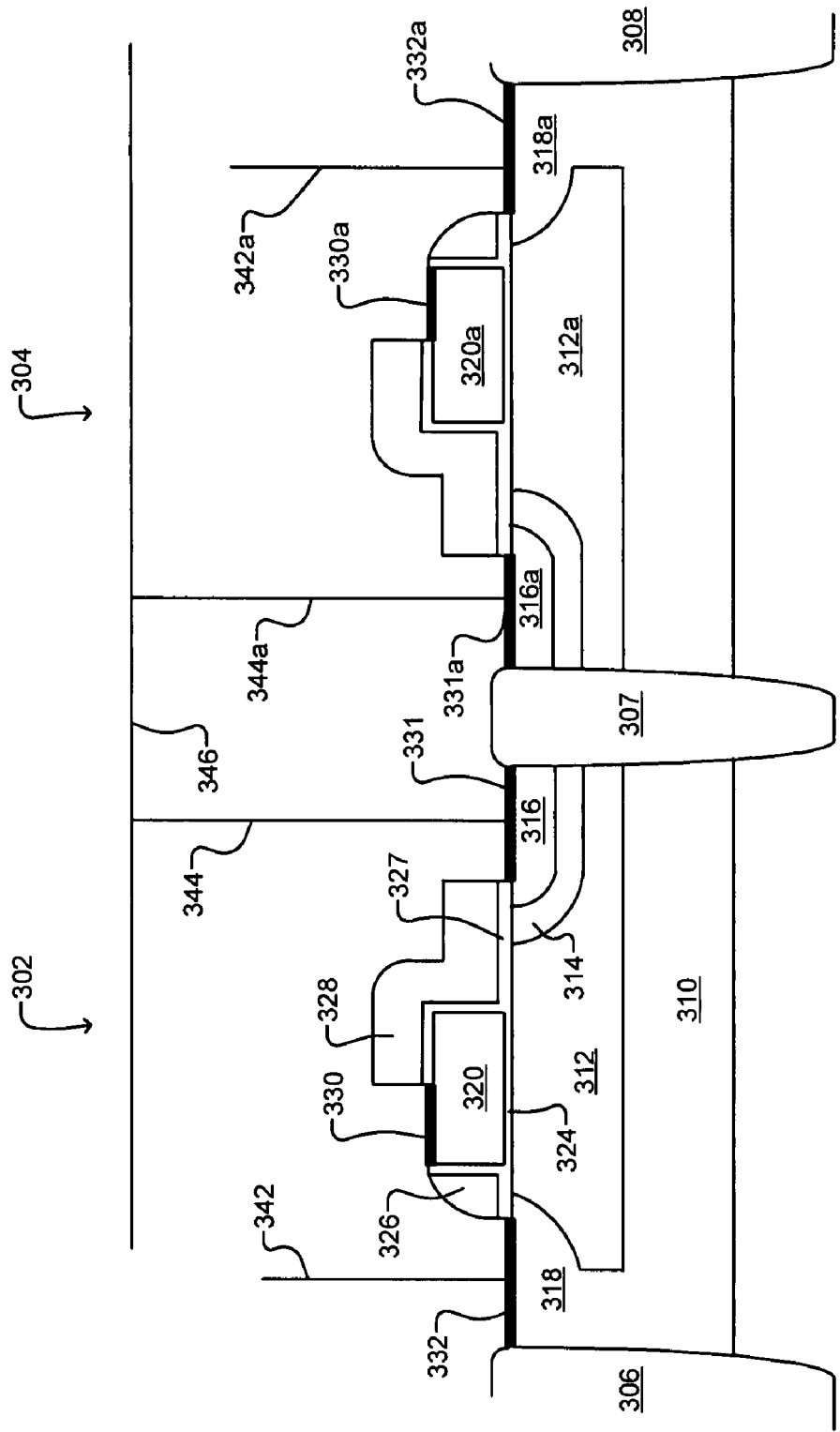
FIG. 7A is a diagram showing the cross section of two adjacent memory cells of another embodiment of the present invention.
Figure 7B:
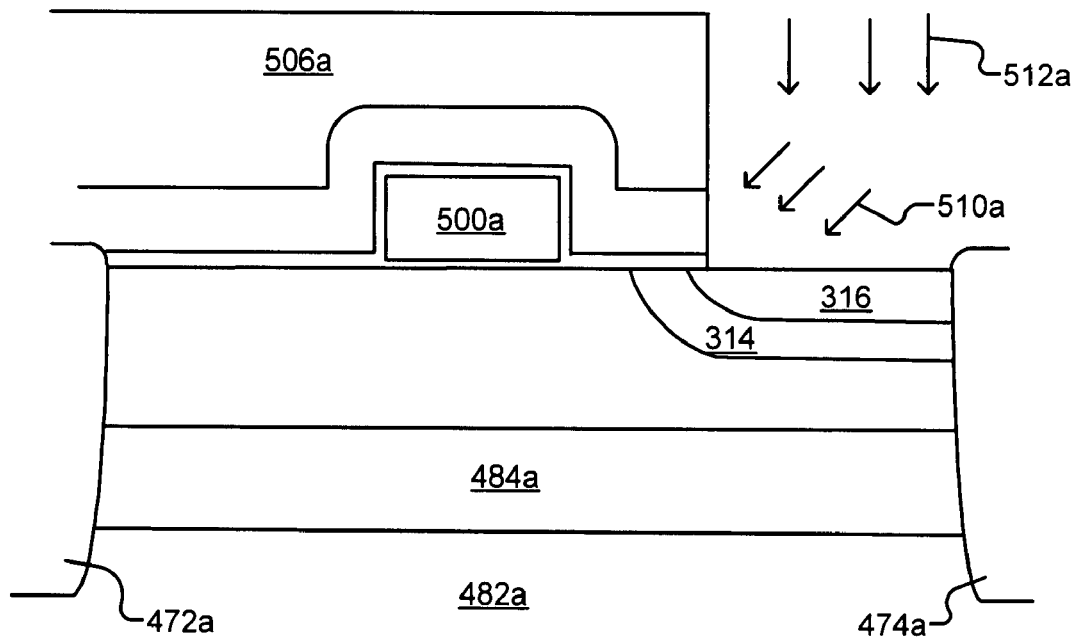
FIGS. 7B-7F show the cross section of various steps in the fabrication of the embodiment of FIG. 7A.
Figure 7C:
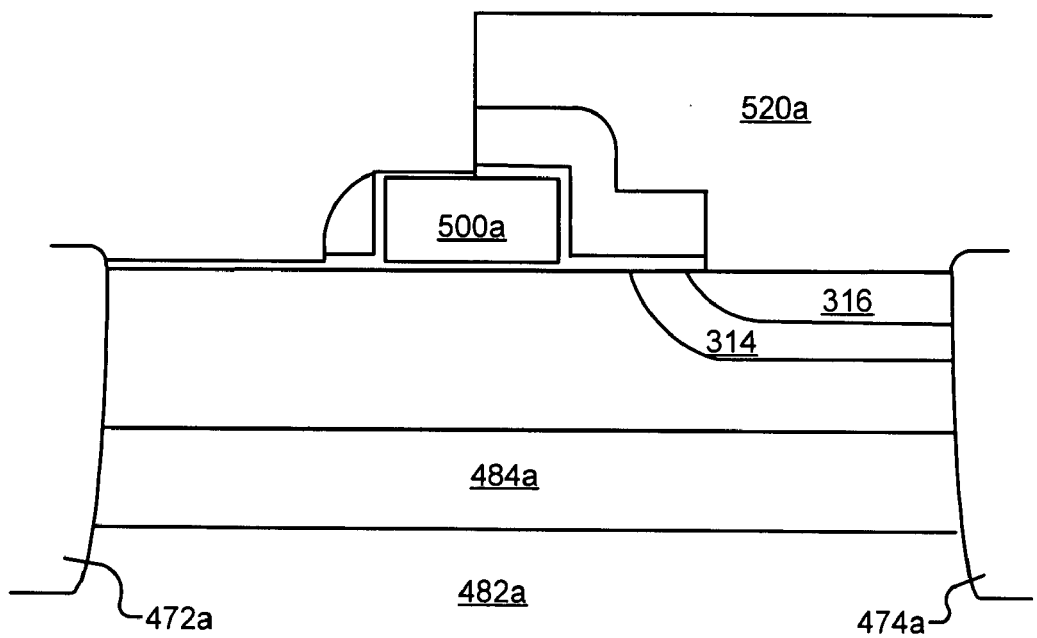

Two exemplary capacitively coupled thyristor memory cells 302 and 304 of another embodiment are shown in FIG. 7A. They are separated from each other and other memory cells by oxide isolation or shallow trench isolation ("STI") regions 306-308. The structure of these cells are substantially identical, thus only one of the cells (e.g., cell 302) is described in detail. Cell 302 comprises a thyristor body having an N region 310, P-base region 312, N-base region 314 and P+ region 316. An N+ region 318 is formed between P-base 312 and oxide/STI region 306. N+ region 318 provides electrical connection between N region 310 and a word line, as explained in more details below. A control port 320 is deposited on top of a gate dielectric 324, which is deposited on top of P-base 312. Spacer materials 326-328 may be formed adjacent to control port 320. Salicide regions 330-332 are formed on top of control port 320, P+ region 316, and N+ region 318, respectively, in areas not covered by spacer materials 326-328.

In one embodiment, it is desirable to increase the coupling between control port 320 and P-base region 312. One way to increase the coupling is to use a longer control port 320. The coupling can also be increased by using a more negative standby wordline2 voltage.

Memory cells 302 and 304 can be used in a memory array. For illustration purposes, some of the components of memory cell 304 are assigned reference numerals that are the same as the corresponding components of memory cell 302 with the letter "a" attached at the end. N+ region 318 of cell 302 can be connected to a word line 342 through salicide region 332. Similarly, N+ region 318a of cell 304 can be connected to a word line 342a through salicide region 332a. Salicide region 331 and 331a can be connected to the same bit line 346. Salicide region 330 can be connected to a wordline2 line (not shown). Similarly, salicide region 330a can be connected to another wordline2 line (not shown).

One way to fabricate the memory cells 302 and 304 is described based on FIGS. 6A-6D and 7B-7F. For simplicity, the details of fabricating one cell are shown. Formation of the trench isolation is similar to FIG. 6A and as described above. Formation of a layer of screen oxide and the deep P-type implant, N-type implant, and a shallow P-type implant are used to form a deep P-well 482 near the bottom of the trenches, an N-well 484 in the middle, and a top P-well 486 are similar to that shown in FIG. 6B, excepting the exemplary doses, energies and resulting layer thicknesses. For the deep P-well, a boron implant having a peak near the bottom of the trenches and resulting in a concentration of about $3 \times 10^{17}$ cm$^{-3}$ can be used. For the N-implant, an arsenic implant having a peak approximately 150 nm above the bottom of the trenches and a peak concentration of about $3 \times 10^{18}$ cm$^{-3}$ can be used. For the top P-implant, a boron implant having a peak less than 100 nm below the screen oxide and a peak concentration of about $10^{18}$ cm$^{-3}$ can be used. In one embodiment, top P-well 486 and N-well 484 are approximately 150 nm thick. Screen oxide layer 480 can then be removed.

The formation of a gate stack, control gate and the photoresist defining the anode region are similar to the formation shown in FIGS. 6C and 6D and described above.

In FIGS. 7B-7F, components that are similar to the corresponding components in FIGS. 6E-6I have the same reference numerals with the letter "a" appended at the end. The spacer material is etched and an angle implant 510a of N-type dopant is used to create the N-base region 314 (see FIG. 7B) which does not connect to the existing N-well. A substantially vertical implant 512a of P-type dopant is used to create a P-type anode region 316. An angle implant (not shown) of P-type dopant (e.g., boron) may also be applied for additional doping in the P-base region of the thyristor. In one embodiment, anode region 316 is approximately 80 nm deep and 0.5 µm wide while N-base region 314 is approximately 100 nm wide at the top surface of silicon. A description of anode formation is provided in U.S. Pat. No. 6,767,770 title Method of Forming Self-Aligned Thin Capacitively-Coupled Thyristor Structure. An optional carbon implant can also be performed. Carbon implant is described in U.S. Pat. No. 7,075,122 titled Thyristor Device with Carbon Lifetime Adjustment Implant and Its Method of Fabrication.

Figure 7D:
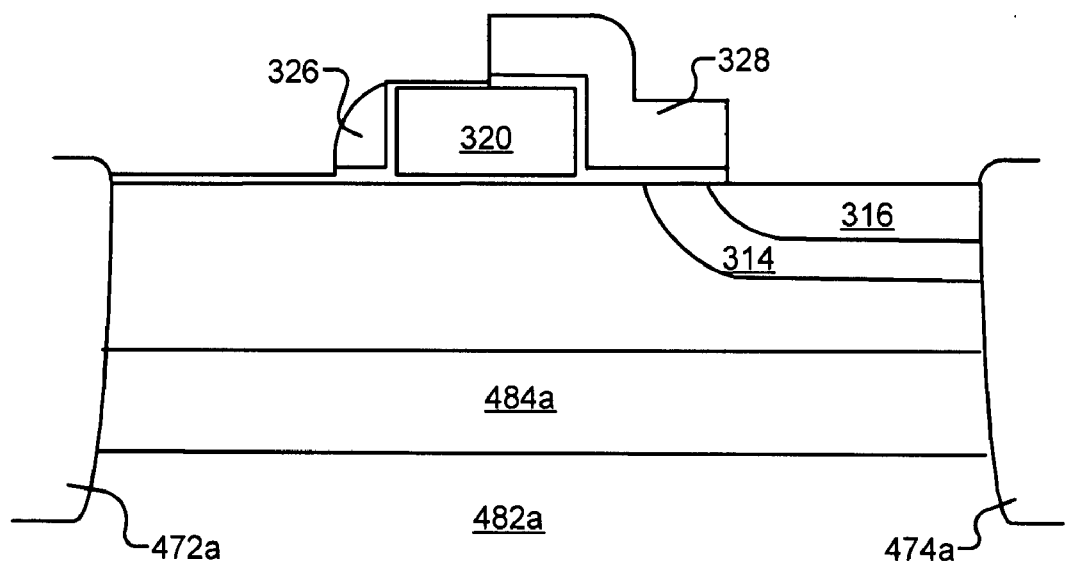
Figure 7E:
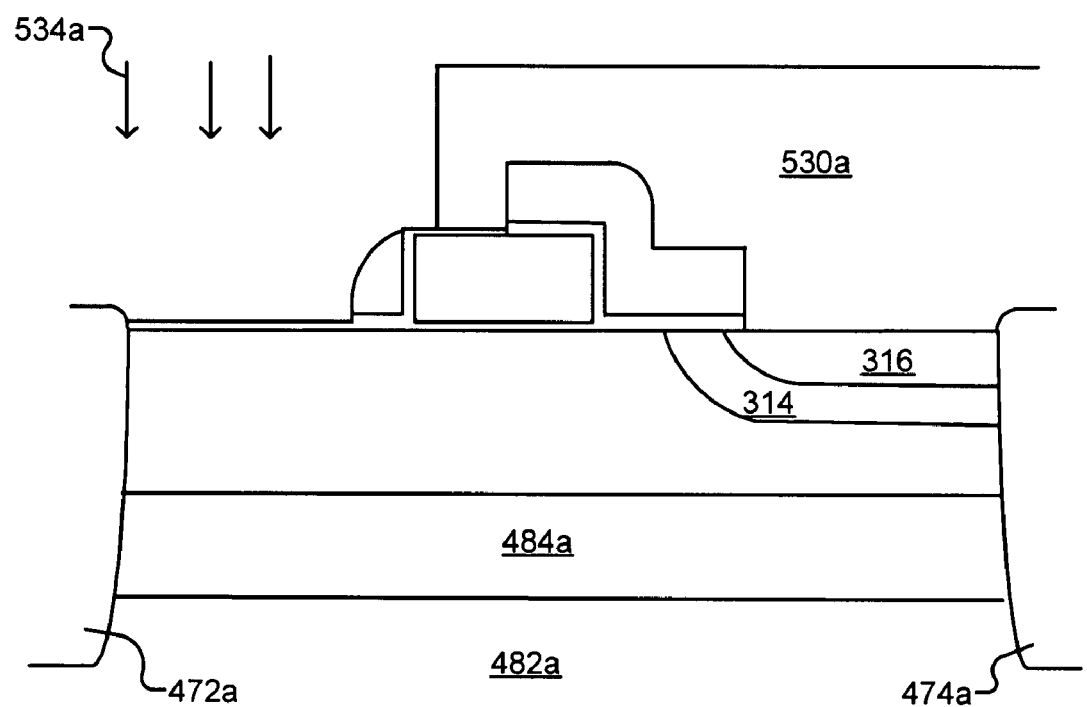

Photoresist 506a is stripped. A new photoresist 520a is deposited to define another opening (see FIG. 7C). This opening covers the cathode region of the thyristor and also regions that are not part of the thyristor. The spacer material that is not protected by photoresist 520a is etched. Etching of spacer material is described in above-mentioned U.S. Pat. No. 6,767,770. FIG. 7D shows the structure after photoresist 520a is stripped. Control gate 320 is surrounded by spacers 326 and 328.

Figure 7F:
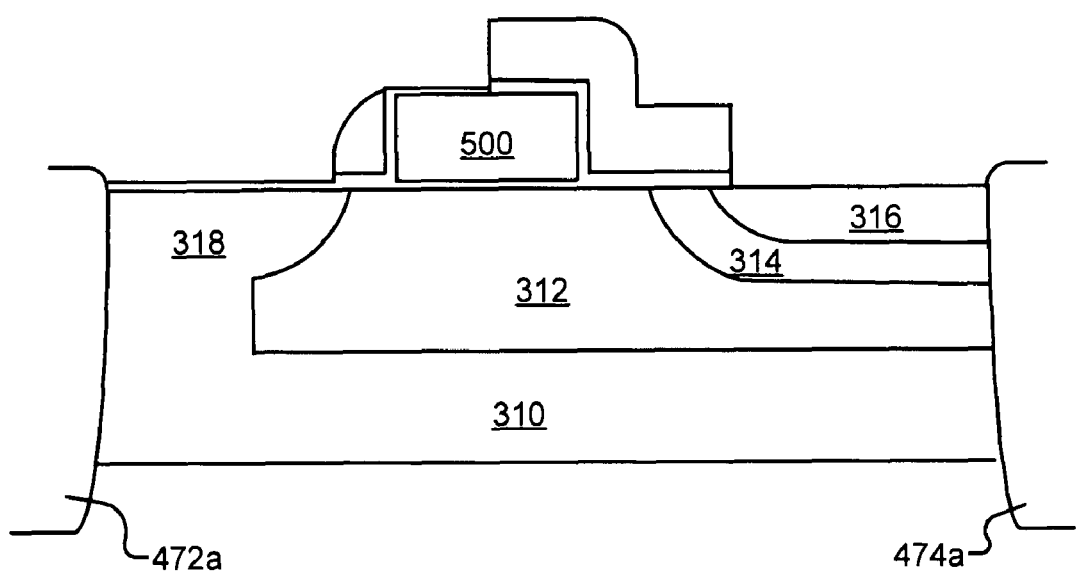

After spacers 326 and 328 are formed, the cathode region is now fabricated. A photoresist 530a is deposited (see FIG. 7E). A substantially vertical implant 534a of N-type dopant (e.g., arsenic) is used to create an N-type cathode region and connect to the N-well. Photoresist 530 is then stripped. FIG. 7F shows the resulting structure with the N-type cathode region 318. In one embodiment, cathode region 318 is approximately 0.25 µm wide while P-base region 312 is approximately 0.5 µm at the top surface of silicon.

Regular CMOS processing, such as rapid thermal anneal and silicide formation, can be used to complete the fabrication. Heavy ion leakage implant can also be applied to the anode region. Details of such implant are described in the above mentioned U.S. Pat. No. 7,075,122.

Figure 8:
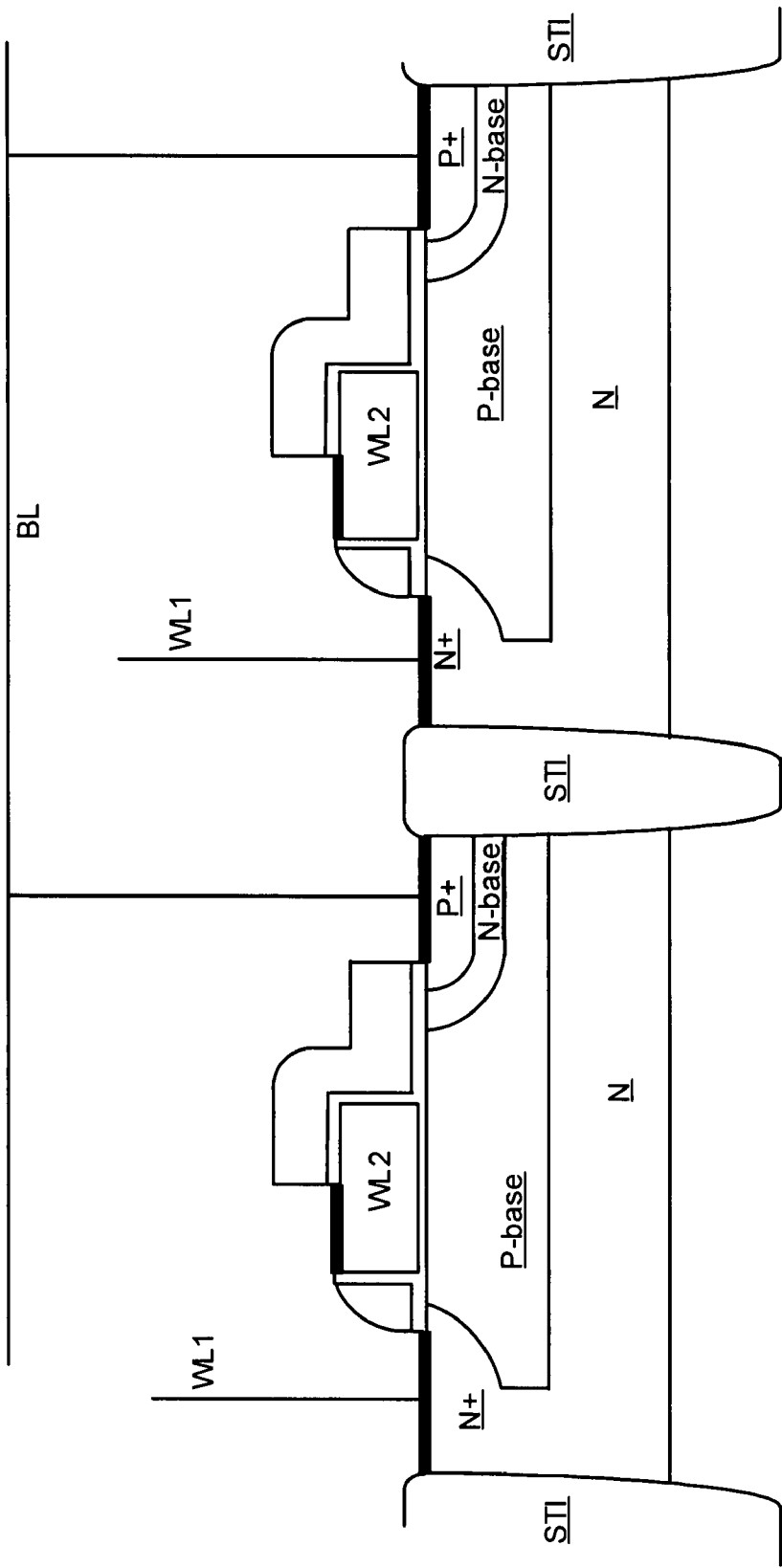
FIG. 8 is a variation of the embodiment of FIG. 7A.

The embodiment shown in FIG. 8 is similar to that in FIG. 7A with the orientation of cell 304 reversed. In FIG. 8, abbreviated names of various regions and signal lines are used instead of reference numerals for easy comprehension.

In a different electrical arrangement, the connection of BL and WL1 to the cathode and anode of the thyristors in FIGS. 7A and 8 can be reversed.

Figure 9A:
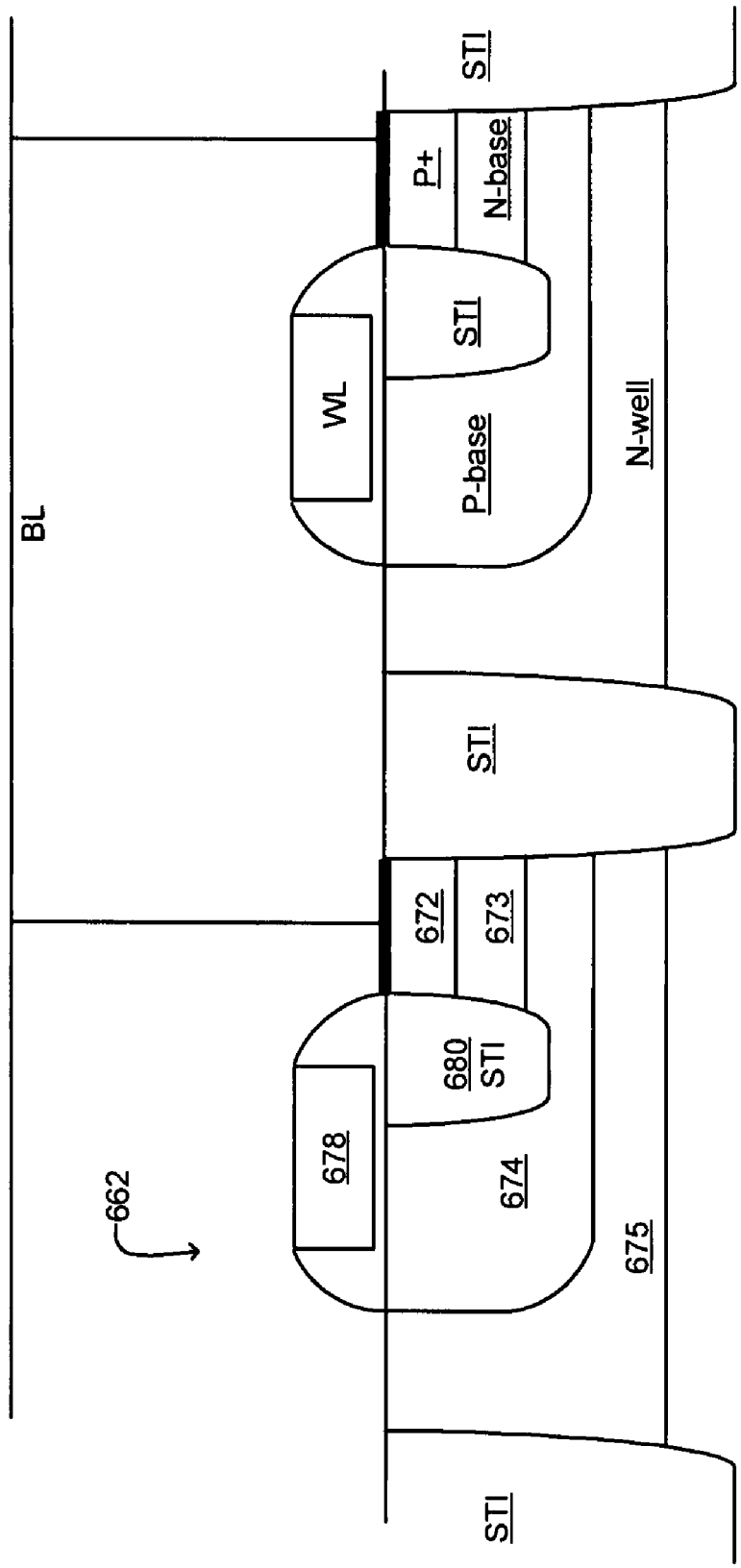
FIG. 9A is a diagram showing the cross section of two adjacent memory cells of a further embodiment of the present invention.
Figure 9B:
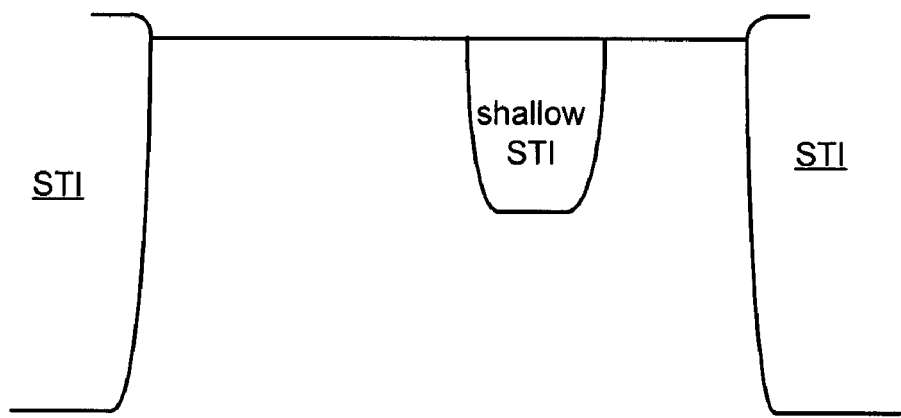
FIGS. 9B-9D show the cross section of various steps in the fabrication of the embodiment of FIG. 9A.
Figure 9C:
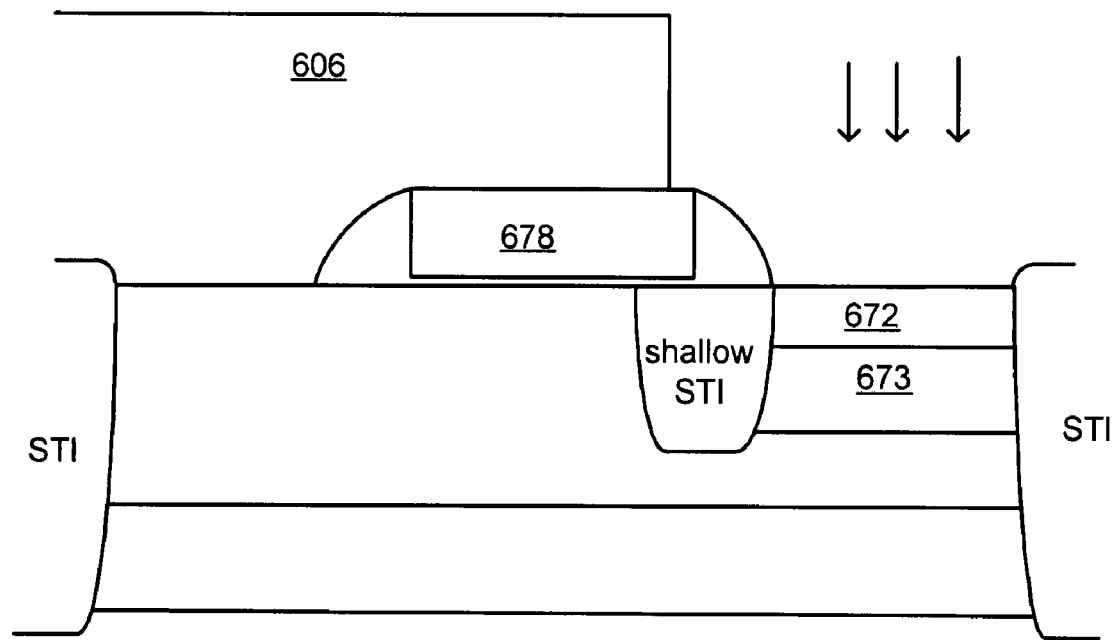
Figure 9D:
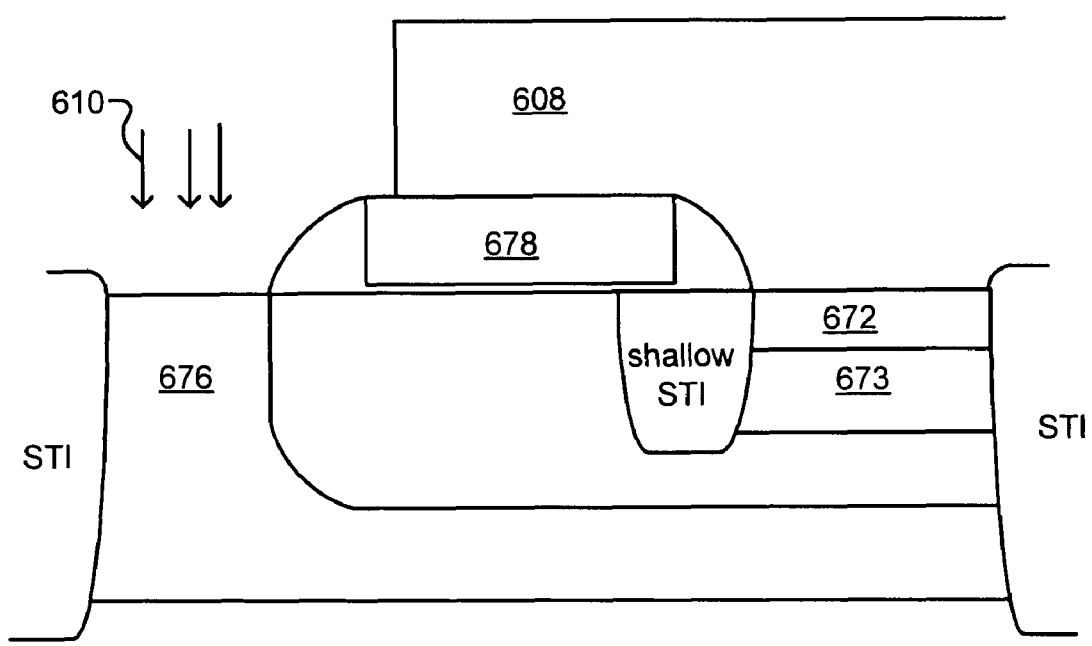

An additional STI can also be used to remove N-base and wordline overlap. FIG. 9A shows a memory cell 662 that comprises a control gate 678 and a thyristor body (a P+ region 672, an N-base region 673, a P-base region 674, and an N+ region 675). An additional STI 680 is positioned between gate 678 and the thyristor body of P+ region 672 and N-base region 673. Another advantage of this embodiment is that it leads to improved junction leakage.

One way to fabricate the memory cell 662 is described based on FIGS. 6A-6D and 9B-9D. For simplicity, the details of fabricating one cell are shown. Formation of the first deep trench isolation is similar to FIG. 6A and as described above. A second (shallower) STI, corresponding to STI 680 in FIG. 9A, is then formed within the active region defined by the first, deeper STI (see FIG. 9B). Formation of a layer of screen oxide and the deep P-type implant, N-type implant, and a shallow P-type implant of FIG. 6B are used to form a deep P-well near the bottom of the trenches, an N-well (later fabricated to become N-well 675 of FIG. 9A) in the middle, and a top P-well (later fabricated to become P-base 674 of FIG. 9A), excepting the exemplary doses, energies and resulting layer thicknesses. For the deep P-well, a boron implant having a peak near the bottom of the first deep trenches and resulting in a concentration of about $3 \times 10^{17}$ cm$^{-3}$ can be used. For the N-implant, an arsenic implant having a peak approximately 150 nm above the bottom of the first deep trenches and a peak concentration of about $3 \times 10^{18}$ cm$^{-3}$ can be used. For the top P-implant, a boron implant having a dosage a peak less than 100 nm below the screen oxide and a peak concentration of about $10^{18}$ cm$^{-3}$ can be used. In one embodiment, top P-well 486 and N-well 484 are approximately 150 nm thick. Screen oxide layer 480 can then be removed.

A gate stack and a control gate 678 are formed (similar to the formation shown in FIGS. 6C and 6D above). Note that one edge of the gate is located over the shallow STI region (see FIG. 9C).

The unmasked spacer material is etched and a photomask 606 is applied. An implant of N-type dopant is used to create an N-base region 673 (see FIG. 9C) which does not connect to the existing N-well and whose junction with the P-well is above the bottom of the shallow STI. A substantially vertical implant of P-type dopant is used to create a P-type anode region 672. In one embodiment, anode region 672 is approximately 80 nm deep and 0.5 μM wide while N-base region 673 is approximately 100 nm wide. A description of anode formation is provided in U.S. Pat. No. 6,767,770 title Method of Forming Self-Aligned Thin Capacitively-Coupled Thyristor Structure. An optional carbon implant can also be performed. Carbon implant is described in U.S. Pat. No. 7,075,122 titled Thyristor Device with Carbon Lifetime Adjustment Implant and Its Method of Fabrication.

The cathode region is now fabricated. A photoresist 608 is deposited (see FIG. 9D) and exposed. A substantially vertical implant 610 of N-type dopant (e.g., arsenic) is used to create an N-type cathode region 676 and connect to the N-well. Photoresist 608 is then stripped. In one embodiment, cathode region 676 is approximately 0.25 μm wide while P-base region 674 is approximately 0.5 μm at the top surface of silicon.

Regular CMOS processing, such as rapid thermal anneal and silicide formation, can be used to complete the fabrication. Heavy ion leakage implant can also be applied to the anode region. Details of such implant are described in the above mentioned U.S. Pat. No. 7,075,122.

Figure 10:
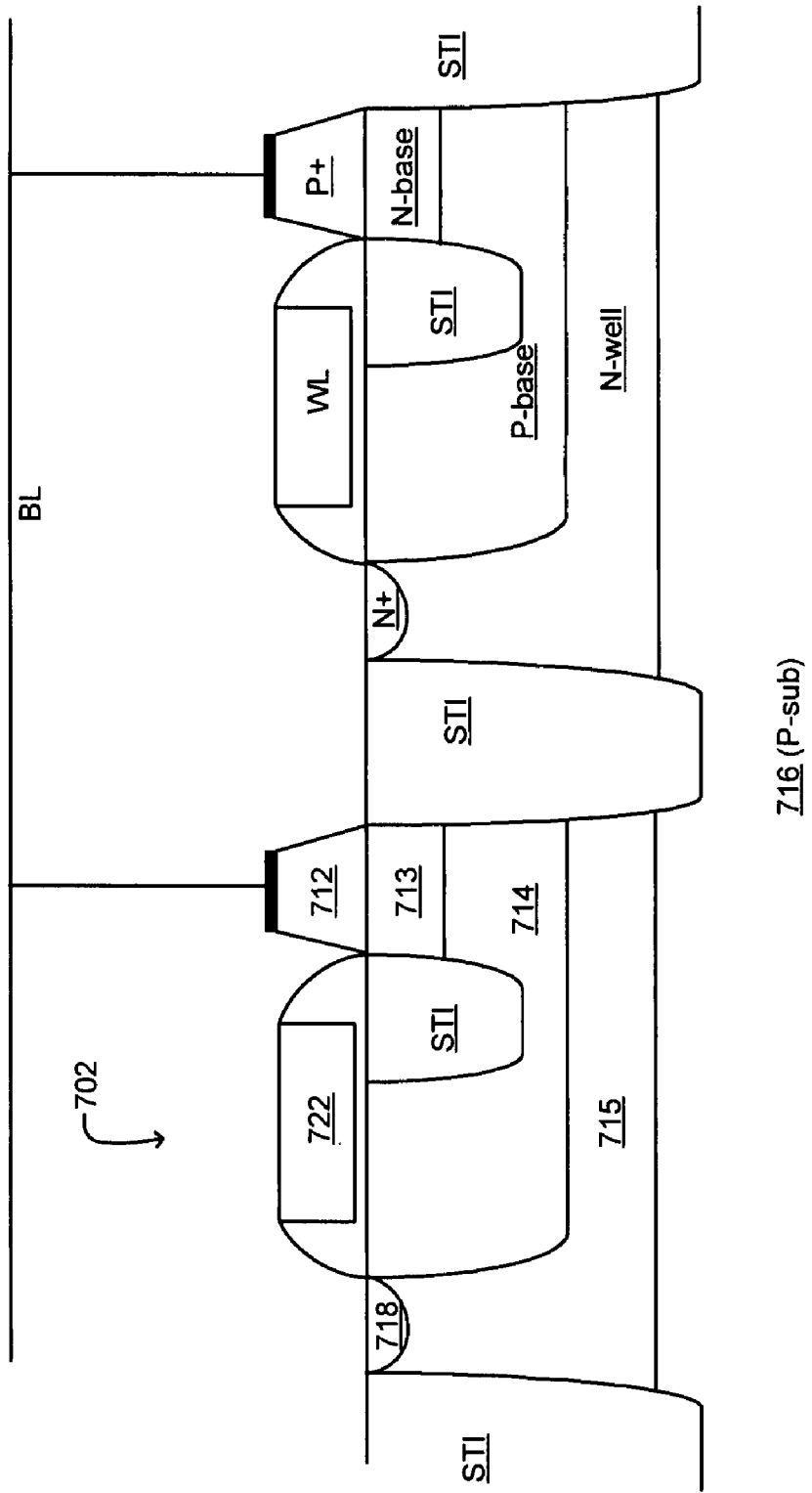
FIG. 10 shows an embodiment of two adjacent memory cells with raised P+ region.

FIG. 10 shows an embodiment of a memory cell 702 with raised P+ region 712. The thyristor body also comprises an N-base region 713, a P-base region 714 and an N-well 715. The cell is fabricated on a P-sub 716. An N+ region 718 is formed near the surface of N-well 715. Memory cell also has a control gate 722. Methods to fabricate raised P+ region 712 can be found in U.S. Pat. No. 6,888,176 titled "Thyristor Semiconductor Device," which is incorporated herein by reference.

The memory cells of FIGS. 5A, 7A, 8, 9A and 10 can have alternative structures. Some of the alternatives are (1) all the N and P type regions can be reversed, (2) only the control gate is salicided (polyside process), (3) salicide completely blocked from all regions, (4) raised source/drain processing can be performed on the anode and/or cathode side (a description of performing such processing on the anode and cathode of a thyristor can be found in U.S. Pat. No. 6,888,176), (5) Hi-K material can be used as gate dielectric, and (6) metal gate can be used as the control gate.

Figure 11:
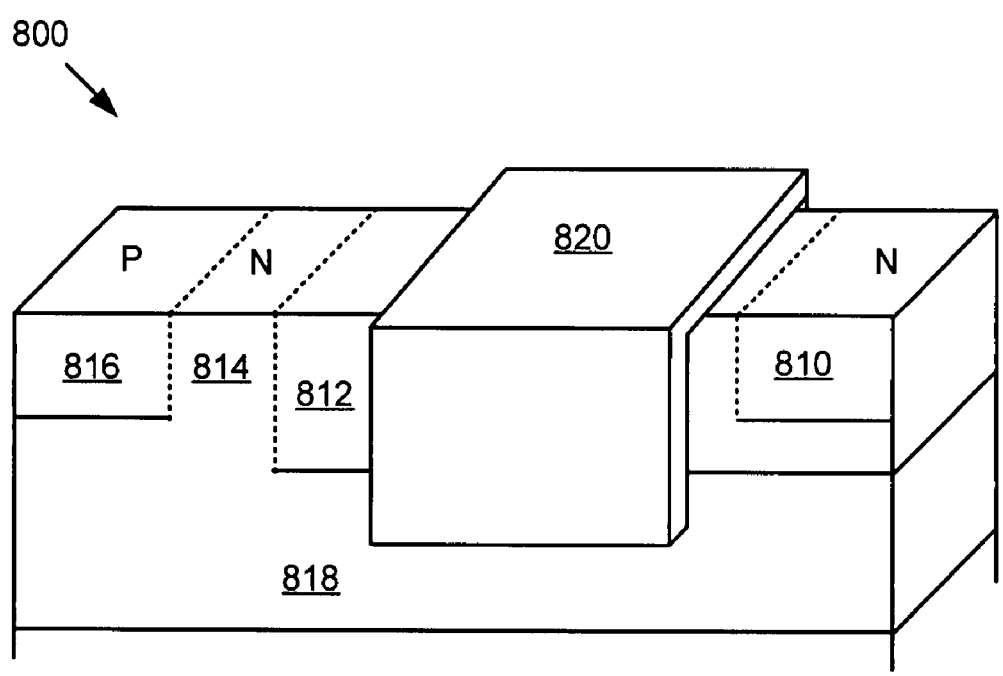
FIG. 11 shows an additional embodiment of a memory cell of the present invention.

As an additional alternative structure, the control gate can be capacitively coupled to the P-base on the vertical sidewalls that are perpendicular to the control gate instead of or in additional to capacitively coupling from the top. An example of such a memory cell 800 is shown in FIG. 11. Memory cell 800 is positioned between two STI regions (not shown). It comprises a control gate 820 and a body (P region 816, N-base region 814, P-base region 812, and N region 810) sitting on top of an N-well 818. This structure can be fabricated using the technique described above and a publication titled "Fabrication of Body-Tied FinFETs (Omega MOS-FETs) Using Bulk Si Wafers" by T. Park, et al., published in the 2003 Symposium on VLSI Technology Digest of Technical Papers.

While the foregoing describes exemplary embodiments in accordance with one or more aspects of the invention, other and further embodiments in accordance with the one or more aspects of the invention may be devised without departing from the scope thereof, which is determined by the claims that follow and equivalents thereof.

We claim:

1. A memory array comprising:
a plurality of memory cells, each memory cell comprising a thyristor body and a gate, the thyristor body comprising a first end region, a second end region, a first base region, and a second base region, the gate being positioned over and insulated from at least a portion of one of the first and the second base regions and offset from another of the first and the second base regions;
at least one word line;
at least one bit line;
at least one third line;
the first end region being connected to one of the at least one word line, bit line and third line, the second end region being connected to another of the at least one word line, bit line, and third line, and the gate being connected to remaining of the at least one word line, bit line and third line;
wherein the memory cell is positioned between a first isolation region and a second isolation region in a substrate;
wherein the thyristor body is formed in a semiconductor region of the substrate that extends from the first isolation region to the second isolation region;
wherein the semiconductor region includes a well that has a same type of conductivity as the another of the first and the second base regions;
wherein the thyristor body is formed in the well; and
wherein a remaining portion of the well after formation of the thyristor body extends below the thyristor body.

2. The array of claim 1 wherein the first end region is connected to a word line, the second end region is connected to a bit line, and the gate is connected to the third line.

3. The array of claim 1, wherein the substrate has opposite type of conductivity as the well.

4. The array of claim 1, wherein the one of the first and the second base regions is contiguous to the remaining portion of the well.

5. The array of claim 1, wherein one of the first and the second end regions is not contiguous to the remaining portion of the well.

6. The array of claim 1, wherein one of the first and the second end regions is contiguous to the remaining portion of the well.

7. The array of claim 6, wherein the remaining portion of the well is not contiguous to another of the first and the second end regions and the another of the first and the second base regions.

8. The array of claim 1, wherein at least one of the first and the second end regions comprises leakage implant material.

9. The array of claim 1, wherein the memory cell does not include an access device.

10. The array of claim 1, wherein the plurality of memory cells respectively do not include access transistors.

* * * * *